United States Patent
Quli et al.

(10) Patent No.: US 11,385,187 B1
(45) Date of Patent: Jul. 12, 2022

(54) METHOD OF FABRICATING PARTICLE SIZE STANDARDS ON SUBSTRATES

(71) Applicant: KLA Corporation, Milpitas, CA (US)

(72) Inventors: Farhat Quli, Union City, CA (US); Paul A. Konicek, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/179,081

(22) Filed: Feb. 18, 2021

Related U.S. Application Data

(60) Provisional application No. 62/992,090, filed on Mar. 19, 2020.

(51) Int. Cl.
*G01N 21/93* (2006.01)
*G03F 7/20* (2006.01)
*G01N 21/95* (2006.01)

(52) U.S. Cl.
CPC ......... *G01N 21/93* (2013.01); *G01N 21/9505* (2013.01); *G03F 7/70516* (2013.01)

(58) Field of Classification Search
CPC .. G01N 21/93; G01N 21/9505; G01N 21/956; G03F 7/70516
See application file for complete search history.

(56) References Cited

U.S. PATENT DOCUMENTS

| | | |
|---|---|---|
| 5,078,492 A | 1/1992 | Scheer |
| 5,453,830 A * | 9/1995 | Greed, Jr. .............. G01N 21/93 356/243.4 |
| 6,339,000 B1 | 1/2002 | Bhattacharya et al. |
| 8,003,940 B2 | 8/2011 | Oosaki et al. |
| 8,126,255 B2 | 2/2012 | Bhaskar et al. |

(Continued)

FOREIGN PATENT DOCUMENTS

| KR | 20100137212 A | 12/2010 |
|---|---|---|
| KR | 20140131681 A | 11/2014 |

OTHER PUBLICATIONS

Int'l. Search Report and Written Opinion from PCT Application No. PCT/US2019/049611 dated Dec. 20, 2019.

*Primary Examiner* — Peter B Kim
(74) *Attorney, Agent, or Firm* — Bever, Hoffman & Harms, LLP

(57) ABSTRACT

A reference substrate for calibrating high-energy inspection systems includes permanently affixed particle-emulating and/or integral void-type environmentally inert surface features that emulate particles/defects having sizes below about 18 nm. Particle-emulating surface features are fabricated directly onto the substrate's surface (or an intervening barrier film layer) using e-beam lithography or over-etch processing. Void-type defect features having sizes below 18 nm are etched into the substrate's surface using, for example, focused ion beam, reactive particle or pin-hole etching processes. Once formed, the actual size of each surface feature is measured (e.g., using SEM) and then recorded. During a subsequent inspection tool calibration session, the reference substrate is scanned and waveform data corresponding to light reflected/scattered from each surface feature is correlated with the scanned feature's actual size data. During subsequent inspection procedures, the sizes of detected particles/defects are determined by matching detected particle/defect waveform data with corresponding surface feature waveform data.

20 Claims, 8 Drawing Sheets

(56) References Cited

U.S. PATENT DOCUMENTS

| | | |
|---|---|---|
| 8,129,242 B2 | 3/2012 | Luo et al. |
| 9,293,298 B2 | 3/2016 | Lauber |
| 10,353,127 B2 | 7/2019 | Wang et al. |
| 10,796,969 B2 | 10/2020 | Quli |
| 2002/0127818 A1 | 9/2002 | Lee et al. |
| 2003/0042520 A1 | 3/2003 | Tsukamoto et al. |
| 2006/0205136 A1 | 9/2006 | Tessariol et al. |
| 2006/0281266 A1 | 12/2006 | Wells |
| 2007/0035726 A1* | 2/2007 | Takahashi .............. G01N 21/93 356/237.1 |
| 2007/0087502 A1 | 4/2007 | Chung-Zen |
| 2012/0181665 A1 | 7/2012 | Kwon |
| 2014/0346612 A1 | 11/2014 | Adam et al. |
| 2017/0373161 A1 | 12/2017 | Schroeder |
| 2018/0113975 A1 | 4/2018 | Sherazi et al. |
| 2019/0214473 A1 | 7/2019 | Xie et al. |
| 2021/0305106 A1* | 9/2021 | Jeang ................. G01N 21/9505 |

* cited by examiner

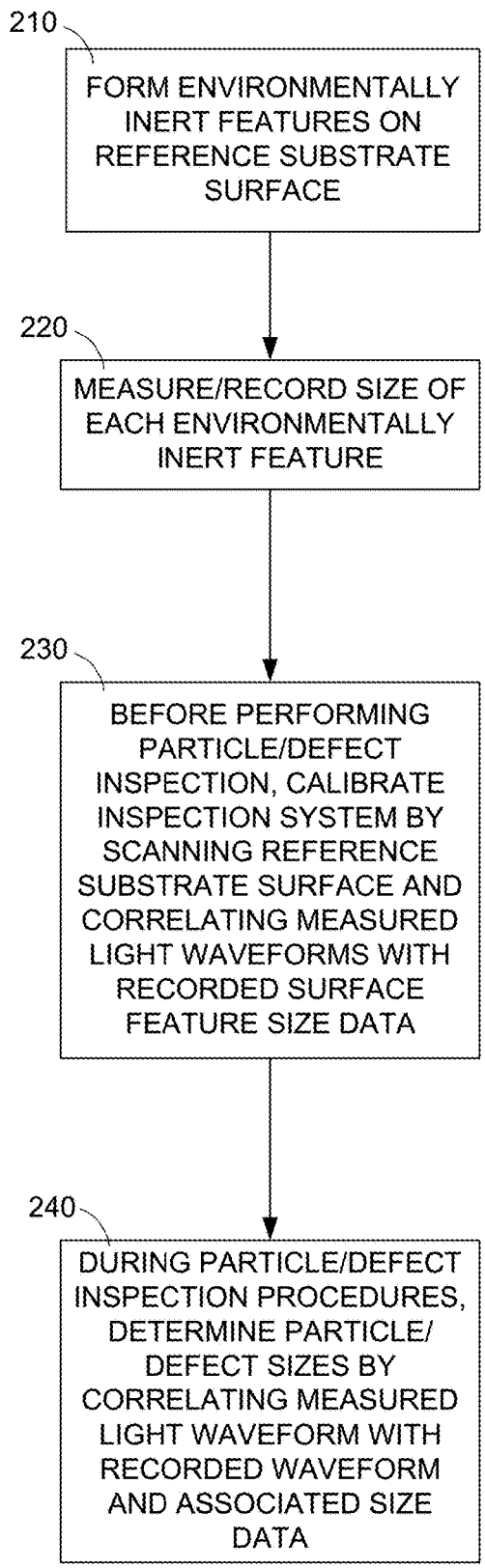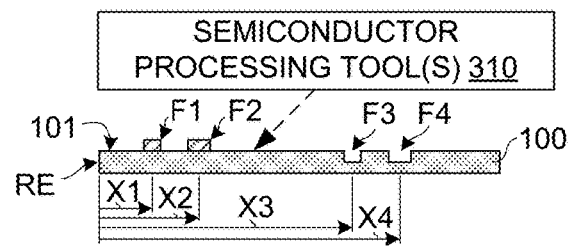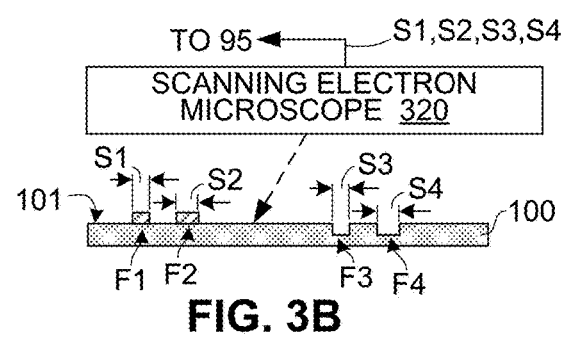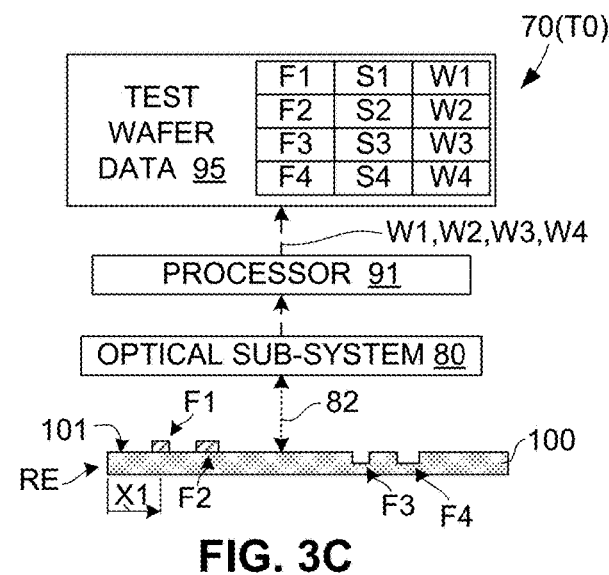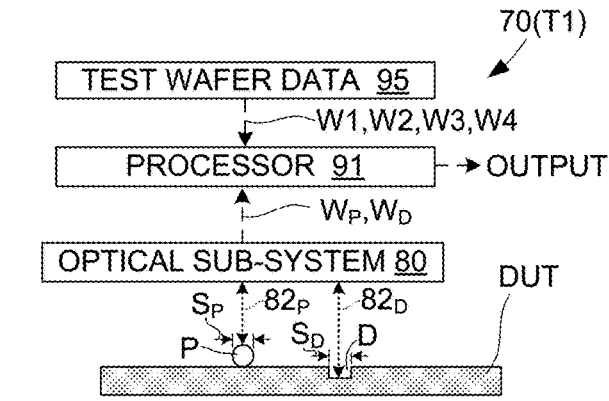
FIG. 2
FIG. 3A
FIG. 3B
FIG. 3C
FIG. 3D

METHOD OF FABRICATING PARTICLE SIZE STANDARDS ON SUBSTRATES

RELATED APPLICATION(S)

This application claims the benefit of U.S. Provisional Patent Application No. 62/992,090, filed Mar. 19, 2020, the entire contents of which are incorporated herein by reference.

FIELD OF THE INVENTION

The present invention relates to particle and/or defect inspection systems utilized in the fabrication of semiconductor wafers, and more particularly to processes for fabricating reference substrates/wafers used during the calibration of these inspection systems.

BACKGROUND OF THE INVENTION

Inspection systems perform a crucial role in advanced process control applied to semiconductor integrated circuit fabrication. Inspection systems are semiconductor fabrication tools that are configured to detect one or more of the two types of fabrication flaws that can damage or "kill" fabricated components: void-type defects (e.g., missing material), which can produce open circuits or reduced component performance; and particle-type defects (unintended extraneous particles), which can produce critical short circuits or other problems. These fabrication flaws can appear on silicon wafers and photomask surfaces during any integrated circuit fabrication stage, so one or more inspection systems are employed multiple times during a given integrated circuit fabrication process.

In general, inspection systems must be capable of distinguishing between critical particles/defects having sizes that are large enough to damage/kill fabricated components from smaller "nuisance" particles/defects that are typically too small to cause serious problems. As ongoing develops in semiconductor fabrication technology continue to provide integrated circuits having ever increasing performance and complexity, there is a concomitant need for inspection systems capable of detecting ever smaller critical fabrication flaws. That is, the ever-increasing performance and complexity of cutting-edge integrated circuits is largely due to continually shrinking device feature sizes, which allows more components (e.g., transistors) to be integrated into smaller packages. As device feature sizes continue to decrease, the size of critical fabrication flaws also continues to shrink, which in turn generates a need for inspection systems capable of identifying increasingly smaller critical fabrication flaws and/or distinguishing these critical particles/defects from smaller "nuisance" particles/defects.

Inspection systems are typically calibrated before they are utilized to detect particles/defects on bare wafers or partially completed integrated circuits (collectively referred to as devices-under-test or DUTs herein). FIGS. 12A and 12B show a current method used to calibrate inspection systems. As indicated in FIG. 12A, silica or polystyrene latex (PSL) particles (or spheres) 52 of a known or well characterizable size are sprayed or otherwise deposited onto a surface 51 a silicon wafer 50 (or other substrate). As indicated in FIG. 12B, the wafer 50 is scanned during calibration of a particle/defect inspection system, where light scattered from particles 52 differs from light scattered by surface 51. By knowing the size of a given particle 52, the light pattern waveform (i.e., scattering response data) generated during calibration can be used to estimate the size of a particle/defect encountered during subsequent inspection of DUTs. For example, when a detected particle generates a substantially identical light pattern waveform as that generated by a given particle of known size, then the detected particle's size can be estimated as being the same as that of the given particle.

Calibration using silica/PSL articles has encountered a few problems when applied to modern inspection tools that are capable of detecting particles/defect sizes below about 18 nm. First, such modern inspection systems utilize high energy laser light that can damage or destroy the silica/PSL particles disposed on a reference wafer. In addition, silica particles can degrade over time and are hard to produce in sizes smaller than 15 nm. Each of these problems makes the accurate calibration of modern inspection tools capable of detecting and measuring particles/defect sizes below about 18 nm difficult or impossible.

What is needed is a reliable way to calibrate modern particle/defect inspection tools that are configured to detect particle/defect sizes below about 18 nm. Specifically, what is needed is a way to reliably emulate particle and defect sizes below 18 nm in a way that undergo high energy laser scanning without damage or distortion.

SUMMARY OF THE INVENTION

The present invention addresses the problems set forth above by providing reference substrate (e.g., a silicon wafer) that is processed to include environmentally inert (non-changing) surface features (artifacts) of a controlled and well characterized (or well characterizable) size dimension below about 18 nm that are fixedly disposed on (e.g., grown or deposited onto, or etched or otherwise integrally formed into) the reference substrate's planar surface. By way of utilizing the materials and/or fabrication techniques described below, the surface features are formed and in a manner that is able to withstand the high laser energy of the modern inspection systems (tools) needed to detect and measure particles/defect sizes below about 18 nm, and can be formed with size dimensions smaller than that achievable using the conventional glass bead approach (i.e., below 15 nm).

In some embodiments the present invention provides a reference substrate (e.g., an Si wafer) for calibrating inspection systems, where the reference substrate includes environmentally inert surface features that are fixedly disposed on the reference substrate's surface, with at least some of the environmentally inert surface features being configured to emulate either a particle or a defect having a size dimension generally below about 18 nm, and more preferably below about 15 nm. In some embodiments, the reference substrate is a semiconductor material (e.g., silicon) having an associated refractive index, light absorption (or scattering) and its upper surface has an associated surface roughness, and these environmentally inert surface features are formed using a material having a different refractive index and/or light absorption than that of the substrate, and/or configured to exhibit a different surface roughness than that of the substrate surface, thereby providing a suitable contrast for accurate detection by the inspection systems to be calibrated. In some embodiments, the surface features are formed by etching or otherwise removing atoms of the reference substrate material to form integral void regions (opening) that extending from the substrate's planar surface into the reference substrate, and in some cases these void-type surface features are filled with a filler material (e.g., silicon dioxide or borophosilicate glass) having different light scattering properties than the substrate material, and then the filler material is planarized (e.g., using CMP) to provide a filler structure having an upper surface that matches the substrate surface. In other embodiments, the surface features are formed as particle-emulating structures fixedly disposed directly on the planar substrate surface or on one or more intervening barrier film layers.

In other embodiments, the invention provides a method for generating a reference substrate configured to provide a reference standard for calibrating inspection systems that are capable of detecting target defects sized below 18 nm includes utilizing one or more processes to permanently (fixedly) form environmentally inert surface features on a planar (e.g., upper) surface of the reference substrate, where each environmentally inert surface feature is configured to emulate the target defects. In some embodiments the surface features are particle-emulating structures comprising an environmentally inert material that are formed/patterned on the reference substrate surface using e-beam (or EUV) lithography, or using conventional lithography in combination with an over-etch process. In other embodiments the environmentally inert surface features are void-type defects that are integrally etched or otherwise formed into the reference substrate surface using focused ion beam processing, reactive particles, or pin-hole inducing particles. In some embodiments the void-type defects are filled prior to CMP processing. In other embodiments one or more barrier film layers are formed between particle-emulating surface features and the reference substrate surface. In some embodiments, after the particle-emulating or void-type surface features are formed, at least some of the surface features are measured (e.g., using SEM), and the actual size of each measured surface feature is recorded for use during subsequent calibration of inspection systems that are capable of detecting target defects sized below 18 nm.

In yet other embodiments, the invention provides an improved method for operating inspection systems of a type capable of detecting particle/defect sizes below 18 nm. The method begins by calibrating the inspection system using a standardized reference substrate of the type described above, where the calibration process involves utilizing the inspection system's optical sub-system to scan the reference substrate's surface and to record (first) waveform data from reflected light patterns that are detected while each surface feature is scanned (e.g., detected light patterns generated as the inspection system's scanning light beam passes over the known or previously recorded location of each surface feature). Each waveform is then recorded in association with the previously recorded actual size value of the scanned associated surface feature. After the calibration procedure is completed, the inspection system is able to determine the size of particles/defects detected on a bare substrate/wafer by matching the (second) waveform data generated by each detected particle/defect with a corresponding recorded (first) waveform data. That is, the (second) waveform data generated by a given detected particle/defect is substantially equal to (first) waveform data generated by a surface feature having the same size as that of the detected particle/defect, so the size of the detected particle/defect can be identified using the feature size associated with the matching recorded (first) waveform data. By forming each reference substrate such that it includes surface features having a wide range of incrementally decreasing particle/defect sizes, the present invention provides a reliable method for accurately identifying the size of each detected particle/defect.

BRIEF DESCRIPTION OF THE DRAWINGS

These and other features, aspects and advantages of the present invention will become better understood with regard to the following description, appended claims, and accompanying drawings, where:

FIG. 2 is a flow diagram depicting a simplified method for generating a reference substrate according to another embodiment of the present invention, and a method for calibrating an inspection system using the reference substrate according to yet another embodiment of the present invention;

FIGS. 3A, 3B, 3C and 3D are simplified cross-sectional side views depicting simplified exemplary processes performed during the method of FIG. 2;

DETAILED DESCRIPTION OF THE DRAWINGS

The present invention relates to an improvement in methods and apparatus/systems for calibrating particle and/or defect inspection systems that utilize laser-based light systems capable of detecting particle/defect sizes below about 18 nm. The following description is presented to enable one of ordinary skill in the art to make and use the invention as provided in the context of a particular application and its requirements. As used herein, directional terms such as "upper" and "lower", are intended to provide relative positions for purposes of description and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
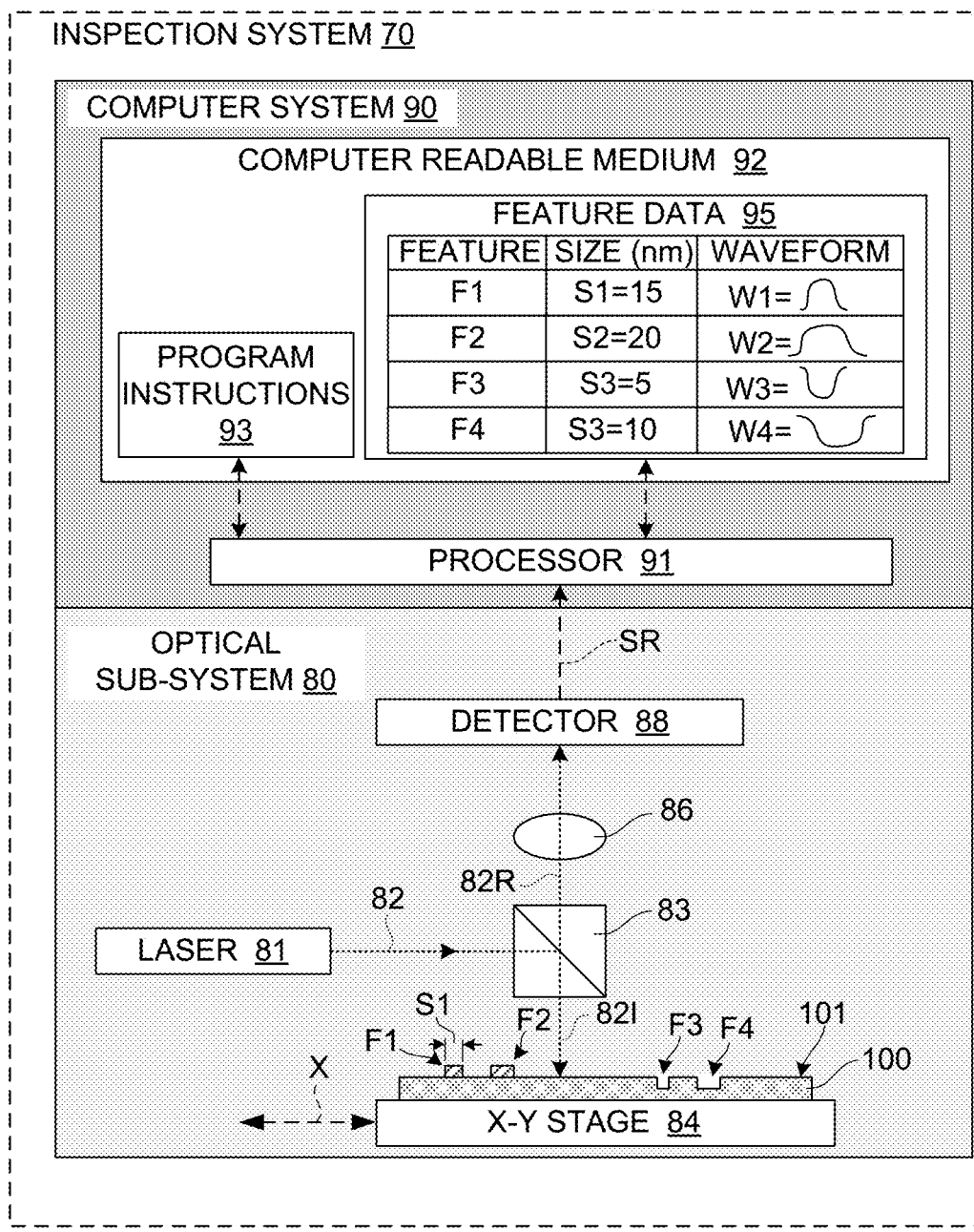
FIG. 1 is a diagram depicting a simplified inspection system during a calibration procedure utilizing a reference substrate produced in accordance with an embodiment of the present invention.

FIG. 1 depicts a greatly simplified particle and/or defect inspection (e.g. metrology) system 70 during a calibration procedure in which inspection system 70 is calibrated using a test wafer 100. Inspection system 70 generally includes an optical sub-system 80 and a computer system 90 that are operably configured to detect at least one of a particle and a defect having a size dimension below 18 nm. According to an aspect of the invention, reference substrate 100 includes inert surface features F1, F2, F3 and F4 that are respectively fixedly disposed on (i.e., grown/deposited onto or integrated/etched into) a planar (upper) surface 101, where each environmentally inert surface feature F1 to F4 is configured to emulate a particle or a defect having a size dimension below 18 nm. In particular, as explained in additional detail below, each environmentally inert surface feature F1 to F4 is formed with a size dimension below 18 nm and is configured to scatter light in a way that is distinguishable from that reflected from planar surface 101 by way of (a) utilizing a material having a different refractive index or different light absorption characteristics than that of the substrate material; (b) being recessed or elevated with respect to the substrate surface, (c) having a different roughness that that of the planar substrate surface; or (d) a combination of any or all of (a) to (c).

Referring to the lower portion of FIG. 1, optical sub-system 80 is configured to detect particles and/or defects having sizes below about 18 nm by way of scanning a target wafer with light generated by a laser 81, and then detecting light reflected from the target wafer during the scanning. In the simplified embodiment depicted in FIG. 1, optical sub-system 80 includes a laser (light source) 81, a beam splitter 83, a movable "X-Y" stage 84, one or more lenses 86 and a detector 88. To facilitate the detection of particle/defect sizes below 18 nm, laser 81 is configured to generate light 82 at a power greater than about 1 watt and/or a wavelength smaller than about 300 nm. Beam splitter 83 is configured to receive light 82 from laser 81, and to direct an incident portion 82I onto a device-under-test (DUT) that is operably mounted onto X-Y stage 84 (e.g., onto reference substrate 100 as indicated in FIG. 1, or onto an unprocessed bare wafer). X-Y stage 83 moves the DUT in a predefined scan pattern (e.g., in horizontal directions X indicated in FIG. 1) such that incident light 82I is scanned across the entire upward-facing surface of the DUT (e.g., across upper surface 101 of reference substrate 100). In some practical embodiments the DUT is spun and the scanned light traces a circular or arched path across the DUT's upper surface. Reflected light 82R, which represents light that is reflected and/or scattered from the DUT's upper surface, is directed through suitable optical elements (e.g., beam splitter 83 and one or more lenses 86) to detector 86. Detector 86 (e.g., a charge coupled device (CCD)) is configured to generate light scattering response (waveform) data W that varies in response to changes in the amount of reflected light 82R collected by lens 86. Those skilled in the art will recognize that optical sub-system 80 greatly simplified for brevity and is intended to represent one of several possible configurations. For example, in some embodiments optical sub-system 80 may utilize other suitable optical elements (not shown) such as one or more condensing lenses, collimating lenses, relay lenses, objective lenses, apertures, spectral filters and polarizing components to direct light from laser 81 to X-Y stage 84 and from X-Y stage 84 to detector 88. Further, optical sub-system 80 may be configured to direct incident light 82I onto a DUT at any suitable incidence angle, and/or to implement multiple light sources and associated channels. Referring to the upper portion of FIG. 1, computer system 90 includes a processor 91 that is configured to receive waveform data W from optical sub-system 80, that operates in accordance with program instructions 93 stored in a computer-readable medium 92 to process the waveform data W during the calibration of inspection system 70 using reference substrate 100, which in turn facilitates the accurate determination of particle/defect sizes detected on the surfaces of DUTs during subsequent scanning operations in the manner described in additional detail below. Computer readable medium 92 may be a storage medium such as a magnetic or optical disk, or a magnetic tape or any other suitable non-transitory computer-readable medium known in the art. Program instructions 93 may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), or other technologies or methodologies, as desired. Computer system 90 is implemented using a personal computer system, image computer, mainframe computer system, workstation, network appliance, Internet appliance, or another standalone or networked electronic device capable of performing the machine instruction operations described herein. In the exemplary embodiment shown in FIG. 1, surface feature data 95 is also stored in computer readable medium 92 and includes both size data values S1 to S4 and light waveform data values W1 to W4 for surface features F1 to F4, respectively. Note that the indicated size data values S1 to S4 (e.g., size value S1 equal to 15 nm) are arbitrarily selected for exemplary purposes, and that waveform data values W1 to W4 are indicated using simple graphic images for explanatory purposes.

FIG. 2 is a flow diagram and 3A to 3D are simplified diagrams depicting the generation of simplified exemplary reference substrate 100, the calibration of an inspection system using reference substrate 100, and the subsequent use of the calibrated inspection system to determine particles/defect sizes according to various aspects of the present invention. Referring to block 210 (FIG. 2) and to FIG. 3A, reference substrate 100 is generated by forming environmentally inert surface features F1 to F4 that are respectively fixedly disposed on upper (planar) surface 101 of the reference substrate 100 using one or more of the processes described herein such that surface features F1 to F4 emulate particles/defects smaller than 18 nm. As generally indicated in FIG. 3A and described in additional detail below, one or more suitable semiconductor processing tools (e.g., lithographic fabrication systems) 310 are utilized to process upper surface 101 in order to form surface features F1 to F4. In one embodiment, each surface feature F1 to F4 is fabricated at a designated location on upper surface 101 (e.g., surface feature F1 is fabricated a distance X1 from a reference edge RE of substrate 100, and surfaces features F2, F3 and F4 are formed at distances X2, X3 and X4, respectively, from reference edge RE), and the locations of each surface feature F1 to F4 are recorded and/or implemented in an established standard. In some embodiments, each surface feature F1 to F4 is fabricated according to a corresponding pre-designated target feature size (e.g., surface feature F1 is fabricated using a target lateral size dimension equal to 15 nm, and surfaces features F2, F3 and F4 are fabricated using target size dimensions of 20 nm, 5 nm and 10 nm respectively). In other embodiments surface feature F1 to F4 are fabricated with sizes and locations that are approximate or unknown, and then later characterized (e.g., during the measurement process described below with reference to block 220). Various alternative processes for forming environmentally inert surface features F1 to F4 having target particle/defect sizes of 18 nm and lower are described below with reference to FIGS. 4 through 11B. Two or more of these processes may be utilized during the production of a single reference substrate (e.g., raised particle-like surface features F1 and F2 may be produced in one region of a substrate using the process described below with reference to FIG. 4, and then void-type surface features F3 and F4 may be produced on a different region of the same substrate using the process described below with reference to FIGS. 5A and 5B). In other embodiments, a reference substrate may be fabricated to include only raised particle-like surface features or only void-type surface features.

Referring to block 220 (FIG. 2), the actual size of each surface feature is measured and optionally recorded for future reference. As indicated in FIG. 3B, in a practical embodiment the actual size S1 to S4 of surface features F1 to F4 is measured using a scanning electron microscope 320 (or another suitable measuring system/method). In some embodiments the measured size values S1 to S4 are recorded with other feature data (e.g., location) in computer readable medium 82 for reference by the inspection system (e.g., during calibration and/or during particle/defect detection processes). In other embodiments the respective measured size values S1 to S4 are utilized to verify that each feature F1 to F4 was successfully fabricated to its associated pre-defined target size value and the measurement process is performed solely to verify that each surface meets its predetermined target size value. In either case, the measurement process depicted in FIG. 3B serves to provide highly accurate and reliable feature size data that can be used to determine the size of detected particles/defects in the manner described below.

Referring to block 230 (FIG. 2), a reference substrate produced and measured as mentioned above is then used to calibrate an inspection system. FIG. 3C shows inspection system 70 at a time T0 (indicated by "70(T0)") during a calibration procedure performed using reference substrate 100, where the calibration process involves scanning laser light generated by optical sub-system 80 across planar surface 101, and utilizing a detector of optical sub-system 80 to generate (first) waveform data entries W1 to W4 in response to light reflected from surface features F1 to F4, respectively. For example, optical sub-system 80 detects certain light patterns generated by light reflected/scattered from reference substrate 100 as the scanning light beam passes over a region of surface 101 that includes feature F1. In one embodiment, the substrate surface region in which surface feature F1 is located may be determined by previously recorded location data (i.e., the optical sub-system 90 scans a region located distance X1 from reference edge RE and generates waveform W1 using the resulting reflected light pattern). Waveform W1 is then recorded (stored) in test wafer data 95 (i.e., in computer readable medium 92, shown in FIG. 1) at a memory location associated with surface feature F1 and previously recorded actual size value S1. In a similar manner, optical sub-system 80 produces light waveform entries W2, W3 and W4 for surface features F2, F3 and F4, respectively, and stores these waveform entries in test wafer data 95.

Referring to block 240 (FIG. 2), after an inspection system is calibrated as described above, it is then used to determine the particle/defect size of particles/defects detected on substrates (e.g., bare silicon wafers) by way of correlating waveforms generated by the detected particle/defect with the waveform data generated and recorded during the calibration process. FIG. 3D shows calibrated inspection system 70 (i.e., the inspection system shown in FIG. 3C at a time T1 subsequent to time T0 and after calibration is completed) during inspection of an exemplary device-under-test DUT, which is depicted as having a particle P and a void-type defect D disposed on its upper surface. Calibrated inspection system 70(T1) is able to determine the size $S_P$ of particle P by controlling optical sub-system 80 to generate (second) waveform data $W_P$ (e.g., by way of detecting light $82_P$ reflected from the surface region of test device DUT that includes particle P), and then by controlling processor 91 to compare waveform data $W_P$ with recorded (first) waveform data entries W1 to W4 stored in test wafer data 95 and to determine which recorded waveform data entry most closely matches waveform data $W_P$. Similarly, inspection system 70(T1) determines the size $S_D$ of defect D by utilizing light $82_D$ reflected when defect D is scanned to generate (second) waveform data $W_D$, then comparing waveform data $W_D$ with waveform data W1 to W4 to determine which entry most closely matched waveform $W_D$. Once a match is found, then the detected particle/defect is assigned the size value associated with the matching (first) waveform W1 to W4. For example, if particle P produces waveform $W_P$ such that matches recorded waveform W1, then size $S_P$ of particle P is assigned the recorded size value S1 (e.g., 15 nm). Similarly, if light $82_D$ reflected from defect D produces waveform $W_D$ such that matches recorded waveform W3, then size $S_D$ is assigned the recorded size value S3 (e.g., 5 nm).

Figure 4:
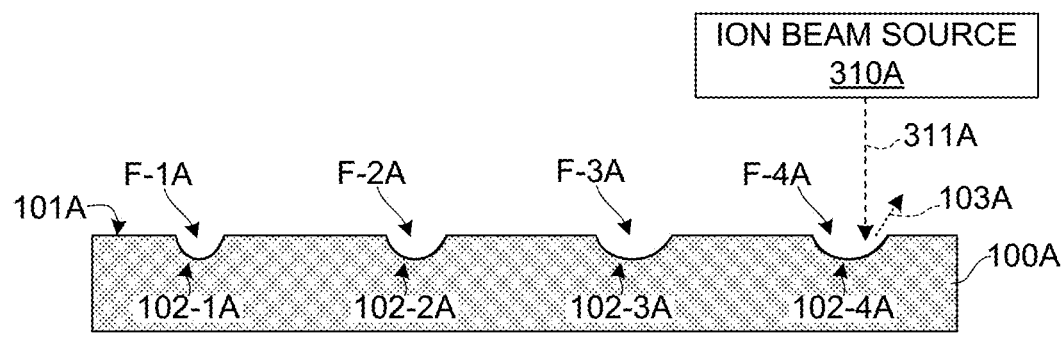
FIG. 4 is a simplified cross-sectional side view showing a method for generating a reference substrate using a focused ion beam.

FIG. 4 depicts an exemplary process for forming void-type environmentally inert surface features F-1A to F-4A on a substrate 100A, where each surface feature F-1A to F-4A is implemented by a void region that extends partially into substrate 100A from an opening/hole in upper surface 101A. In this embodiment, the formation of each surface feature (e.g., feature F-4A) involves operably controlling a suitable ion beam source 310A to direct a focused ion beam 311A onto a corresponding selected region of upper surface 101A such that focused ion beam 311A abrades a targeted portion of reference substrate 100A, whereby surface feature F-4A is defined by a corresponding void region/opening 102-4A that extends from upper (planar) surface 101A into reference substrate 100A. The same process may be used to generate void regions/openings 102-1A, 102-2A and 102-3A during the formation of surface feature F-1A, F-2A and F-3A, respectively. The chief advantage of this specific embodiment is that ion beam 311A can be focused to a resolution of less than 5 nm at upper surface 101A, thereby facilitating the generation of void-type surface features F-1A to F-4A with respective feature sizes that are substantially smaller than those achievable using conventional methods.

Figure 5A:
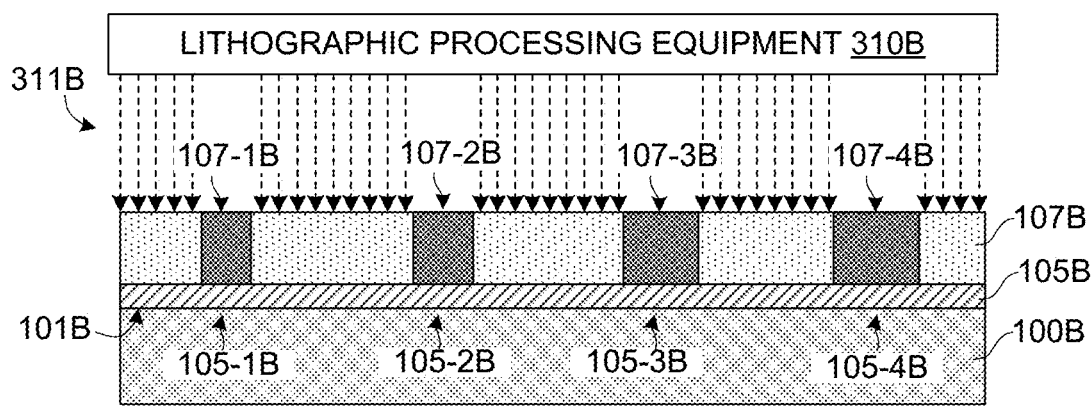
FIGS. 5A and 5B are simplified cross-sectional side views showing a method for generating a reference substrate having lithographically patterned surface features.
Figure 5B:
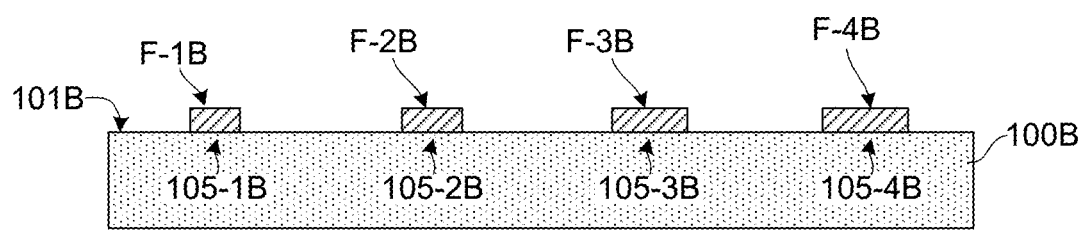
Figure 6A:
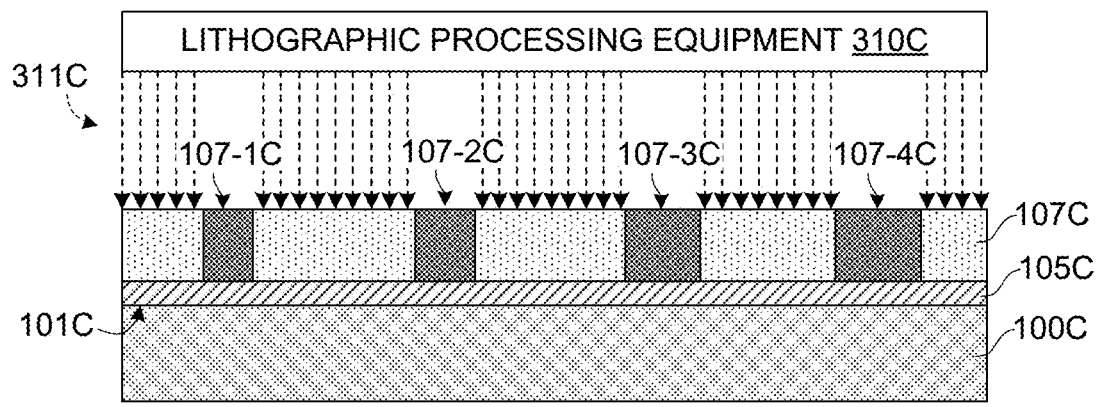
FIGS. 6A, 6B, 6C and 6D are simplified cross-sectional side views showing a method for generating a reference substrate using an over-etch process.
Figure 6B:
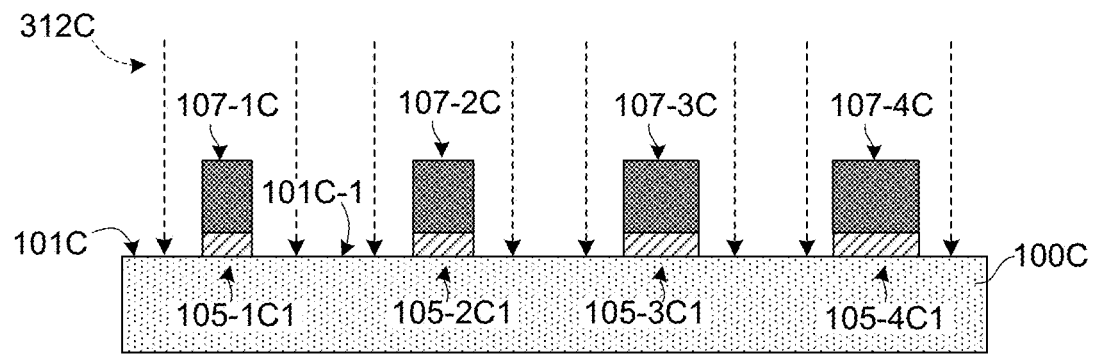
Figure 6C:
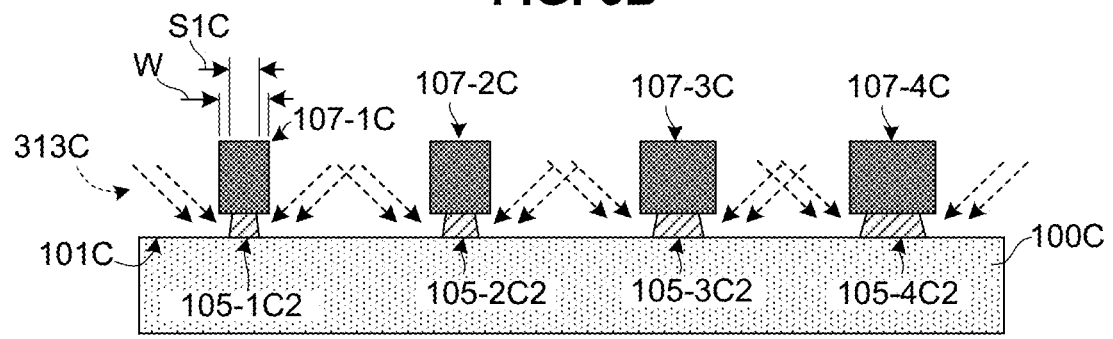
Figure 6D:
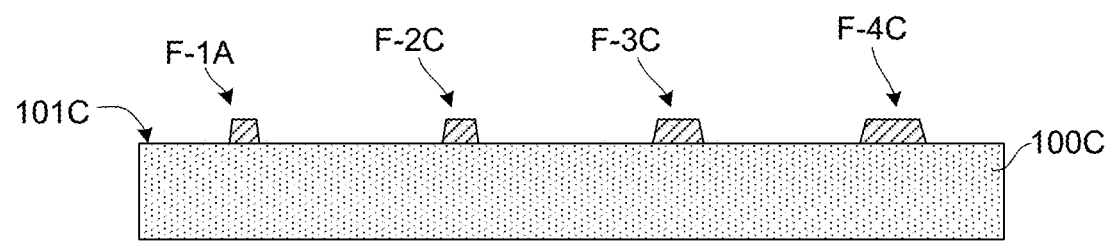
Figure 7A:
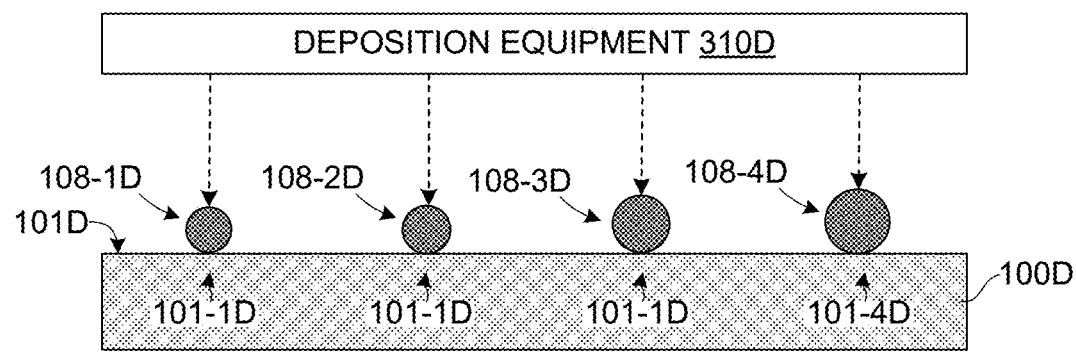
FIGS. 7A, 7B and 7C are simplified cross-sectional side views showing a method for generating a reference substrate using reactive particles.
Figure 7B:
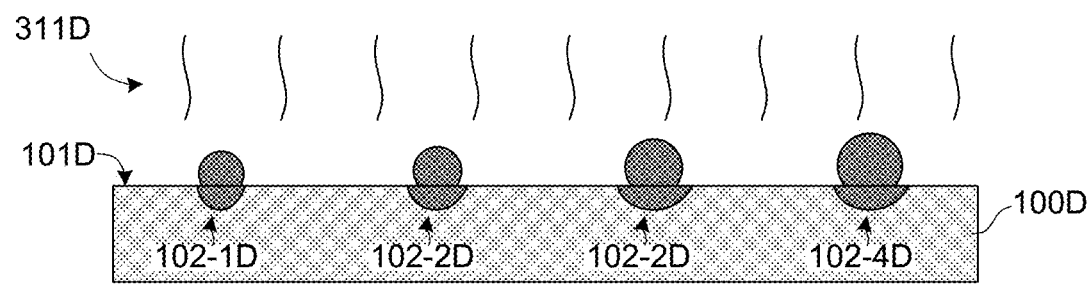
Figure 7C:
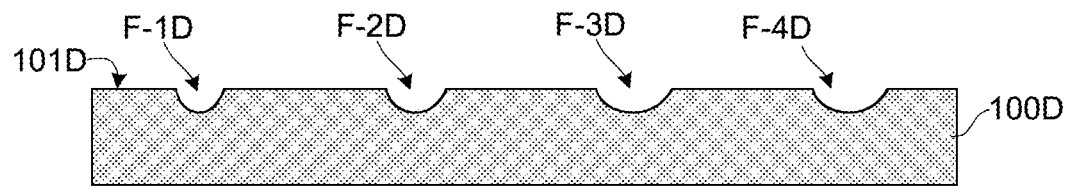
Figure 8A:
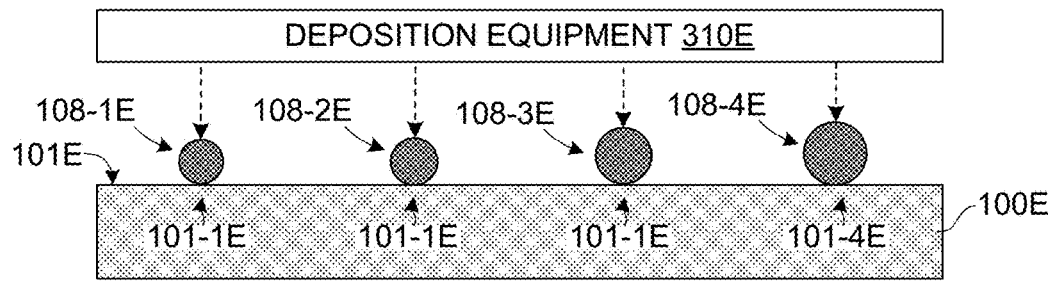
FIGS. 8A, 8B and 8C are simplified cross-sectional side views showing a method for generating a reference substrate using a pin-hole creation process.
Figure 8B:
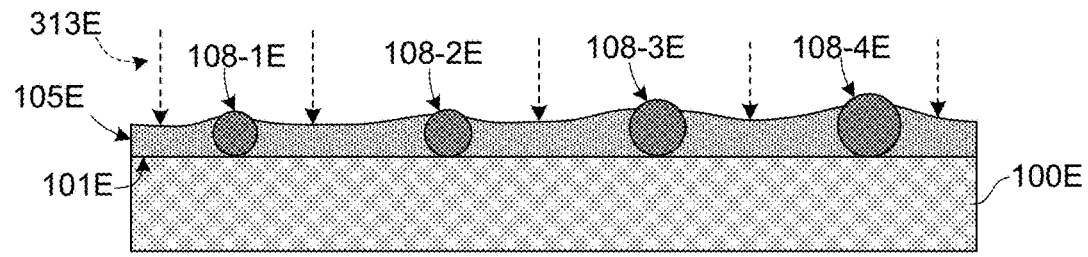
Figure 8C:
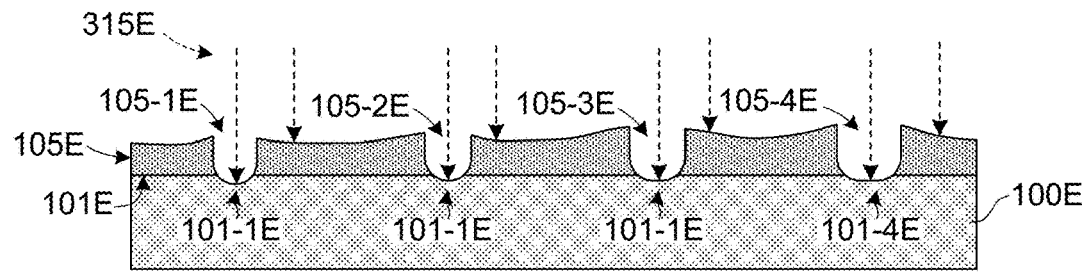
Figure 9A:
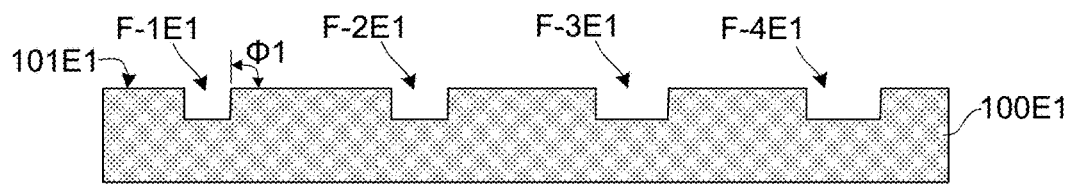
FIGS. 9A and 9B are simplified cross-sectional side views showing alternative methods for generating a reference substrate using anisotropic and isotropic etching processes, respectively.
Figure 9B:
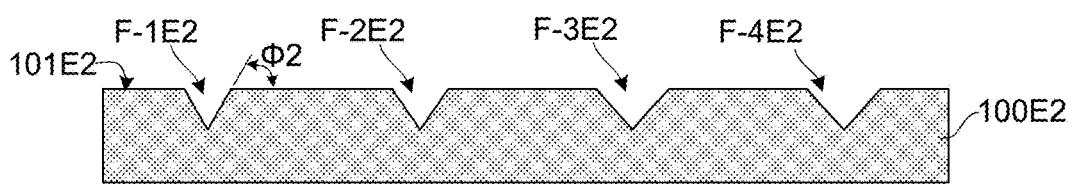

FIGS. 5A and 5B depict an exemplary process for forming environmentally inert surface features F-1B to F-4B on a substrate 100B, where each surface feature F-1A to F-4A is implemented by an associated particle-emulating structure disposed on planar surface 101B of reference substrate 100B. FIG. 5A shows reference substrate 100B after depositing a film layer 105B on upper surface 101B and then lithographically patterning film layer 105B by processing a mask layer 107B using e-beam or EUV radiation 311B, which is generated by appropriate lithographic processing equipment 310B, such that etchant-resistant sections 107-1B, 107-2B, 107-3B and 107-4B of mask layer 107B are formed over corresponding portions 105-1B, 105-2B, 105-3B and 105-4B of film layer 105B, respectively. An advantage to processing mask layer 107B using e-beam lithography is that e-beam lithography facilitates higher resolution than conventional lithography, thereby facilitating the generation of surface features having size dimensions substantially below 18 nm. FIG. 5B shows reference substrate 100B after development etch and resist strip processes have been performed according to known techniques, such that resulting surface features F-1B, F-2B, F-3B and F-4B are formed by residual portions 105-1B, 105-2B, 105-3B and 105-4B of film layer 105B, respectively. In one embodiment, film layer 105B is implemented using silicon oxide, whereby each surface features F-1B to F-4B is implemented by a residual silicon oxide structure. An advantage to forming surface features F-1B to F-4B using silicon oxide is that this approach facilitates well-defined features having different light scattering characteristics (e.g., refractive index and light absorption) than that of planar silicon surface 101B. Further, double or quadruple patterning techniques can be used with conventional lithography for smaller feature sizes. In other embodiment, film layer 105B is generated by depositing platinum or gold on upper surface 101B, whereby each surface features F-1B to F-4B is implemented by a residual platinum or gold structure. An advantage to forming surface features F-1B to F-4B using platinum is that platinum is highly resistant to environmental effects over time (i.e., is highly environmentally inert), which is not true of the silica/glass and PSL utilized by conventional approaches. FIGS. 6A-6D depict another exemplary process for forming particle-emulating-structure-type environmentally inert surface features F-1C to F-4C on an upper planar surface 101C of a substrate 100C, where the artifact size of each surface features F-1C to F-4C is reduced through over etching. FIGS. 6A and 6B depict the patterning of a film layer 105C by way of forming mask structures 107-1C to 107-4C over corresponding initial film layer portions 105-1C1 to 105-4C1 of film layer 105C. FIG. 6A shows reference substrate 100C after depositing a film layer 105C on upper surface 101C and then lithographically patterning film layer 105C using a mask layer 107C, for example, using radiation 311C generated by conventional lithographic processing equipment 310C, thereby forming etchant-resistant mask layer sections 107-1C, 107-2C, 107-3C and 107-4C over corresponding portions of film layer 105C. FIG. 6B depicts reference substrate 100C after an initial etching process during which an etchant 313C is utilized to remove exposed mask layer sections and underlying portions of film layer 105C, leaving etchant-resistant mask structures 107-1C to 107-4C over underlying initial film layer portions 105-1C1 to 105-4C1 (e.g., such that initial film layer portion 105-1C1 is protected by corresponding mask structure 107-1C from removal by etchant 313C). Note that this initial etching process forms initial film layer portions 105-1C1 to 105-4C1 in a spaced-apart manner (e.g., such that initial film layer portion 105-1C1 is separated from adjacent initial film layer portion 105-2C1 by a section 101C-1 of exposed upper surface 101C), and also exposes the peripheral side edges of each initial film layer portion 105-1C1 to 105-4C1). FIG. 6C depict a subsequent over-etch process during which an etchant 313C (which may be the same as etchant 312C) etches the exposed sides of the layer portions underlying etchant-resistant mask structures 107-1C to 107-4C, thereby effectively shrinking the lateral size of underlying layer portions 105-1C2 to 105-1C4 beyond the capabilities of the exposure tool utilized by lithographic processing equipment 310C (e.g., such that a lateral size dimension Sic of residual portion 105-2C1 is smaller than a corresponding lateral size dimension W of mask structure 107-1C). In one embodiment, residual layer portions 105-1C2 to 105-1C4 are silicon oxide formed on silicon reference substrate 100C, and the etching processes depicted in FIGS. 6B and 6C are performed using a wet etch and a buffered oxide etch. FIG. 6D depict reference substrate 100C after the over-etch process is completed at the mask structures have been removed, whereby the layer portions 105-1C2 to 105-1C4 formed using the over-etch process depicted in FIG. 6C become surface features F-1C to F-4C, respectively. FIGS. 7A-7C depict an alternative exemplary process for generating a reference substrate 100D having void-region-type environmentally inert surface features that are formed using a reactive particle process. FIG. 7A shows reference substrate 100D after reactive particles 108-1D, 108-2D, 108-3D and 108-4D have been deposited by associated particle deposition equipment 310D onto corresponding surface locations 101-1D, 101-2D, 101-3D and 101-4D, respectively, of upper surface 101D. FIG. 7B depicts reference substrate 100D during a reactive phase produced by generating suitable operating conditions 311D (e.g., heating conditions sufficient to react the particle material with the underlying substrate material). The reaction phase is performed such that reactive particles 108-1D to 108-4D form compound regions 102-1D to 102-4D, respectively, that extend below upper surface 101D into substrate 100D. In one embodiment, reactive particles 108-1D to 108-4D comprise nickel, which reacts with silicon substrate 100C to form nickel silicide compound regions 102-1D to 102-4D. FIG. 7C depicts reference substrate 100C after the compound regions have been selectively removed (e.g., etched) from substrate surface 101C to create void-region-type surface features F-1D to F-4D on reference substrate 100D. The chief advantage of the reactive particle approach is the low cost of the particle deposition. FIGS. 8A-8C depict another alternative exemplary process for generating a reference substrate 100E having void-region-type environmentally inert surface features that are formed using a process involving pin-hole creation through particle deposition. FIG. 8A shows reference substrate 100D after pin-hole inducing particles 108-1E, 108-2E, 108-3E and 108-4E have been deposited by associated particle deposition equipment 310E onto corresponding surface locations 101-1E, 101-2E, 101-3E and 101-4E, respectively, of upper surface 101E. In one embodiment, pin-hole inducing particles 108-1E to 108-4E comprise any material that can be selectively etched using, e.g., KOH. FIG. 8B depicts reference substrate 100E after a film-forming material (e.g., silicon nitride) 315E is deposited in a manner that forms a protective film 105E on upper surface 101E. Note that pin-hole inducing particles 108-1E to 108-4E act as centers that inhibit clean film growth (i.e., protective film 105E does not extend into regions occupied by particles 108-1E to 108-4E). FIG. 8C depicts reference substrate 100E during an etching process when a suitable etchant 313E, such as potassium hydroxide (KOH), is utilized to selectively remove the pin-hole inducing particles without removing protective film 105E, thereby forming corresponding pin-hole openings 105-1E to 105-4E, and exposing underlying surface locations 101-1E to 101-4E. In this manner, protective layer 105E acts as a mask that facilitates etching features into substrate 100E by removing substrate material below exposed surface locations 101-1E to 101-4E. FIGS. 9A and 9B depict alternative exemplary reference substrates 100E1 and 100E2 that are generated using the pin-hole process described above with reference to FIGS. 8A-8C. Referring to FIG. 9A, reference substrate 100E1 comprises (110) directional silicon, and an anisotropic etch is performed such that environmentally inert surface features F-1E1 to F-4E1 are formed as substantially straight-sided void regions (e.g., the sidewalls of feature F-1E1 are substantially perpendicular to planar surface 101E, as indicated by angle φ1). Referring to FIG. 9B, reference substrate 100E1 comprises (111) directional silicon, whereby etching produces environmentally inert surface features F-1E2 to F-4E2 formed as pyramid-shaped void regions (e.g., such that the sidewalls of feature F-1E1 intersect planar surface 101E at an acute angle θ2).

Figure 10A:
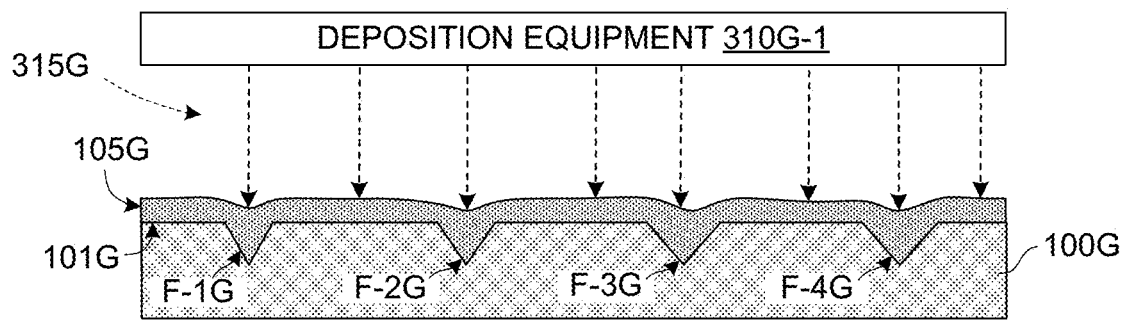
FIGS. 10A and 10B are simplified cross-sectional side views showing a method for generating a reference substrate using filled recess-type surface features.
Figure 10B:
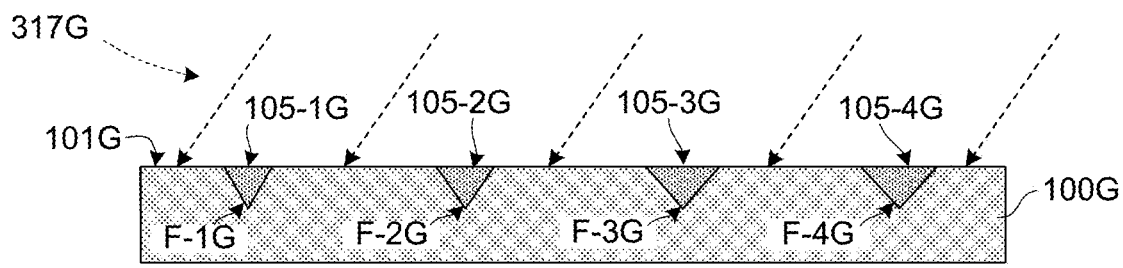

FIGS. 10A and 10B depict another exemplary embodiment in which a reference substrate 1000 having void-type environmentally inert surface features F-1G to F-4G undergoes chemical/mechanical polishing or planarization in order to remove surface contamination or haze incurred during processing, which is important for some inspection tools. Note that void-type surface features F-1G to F-4G are depicted as pyramid-shaped void regions, which are formed as described above with reference to FIG. 9B, but may be implemented using any of the void region generating processes described herein (e.g., those described with reference to any of FIG. 4, FIGS. 7A-7C, FIGS. 8A-8C, FIG. 9A or FIG. 9B). As indicated in FIG. 10A, deposition equipment 310G-1 is utilized to apply a filler material 315G (e.g., silicon dioxide or borophosphosilicate glass) onto upper surface 101G (e.g., by way of chemical vapor deposition (CVD) or spin-on processing) such that lower (filler) portions 105-1G to 105-4G of a filler layer 105G are respectively disposed in (i.e., fill) environmentally inert surface features F-1G to F-4G, and an upper portion of filler layer 105G is disposed over portions of planar surface 101G that are disposed between surface features F-1G to F-4G. As indicated in FIG. 10B, the upper portion of the filler layer is then selectively removed (e.g., by chemical-mechanical polishing (CMP), indicated by arrows 317G) such that the surface sections of planar surface 101G located between surface features F-1G to F-4G are exposed, and filler portions (structures) 105-1G to 105-4G, which represent residual portions of the filler layer shown in FIG. 10A, are respectively disposed in surface features F-1G to F-4G and have upper surfaces that are substantially coplanar with planar surface 101G. By forming filler structures 105-1G to 105-4G using a filler material having different light scattering properties than those produced by planar surface 101G of reference substrate 101, the present embodiment provides reference substrate with both a continuously planar surface and environmentally inert surface features F-1G to F-4G having the beneficial aspects described above.

Figure 11A:
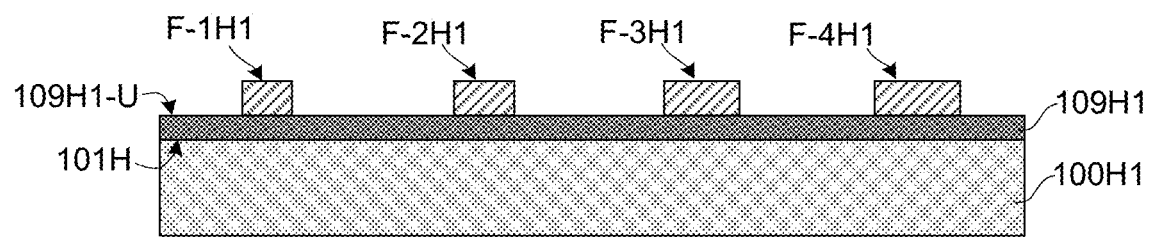
FIGS. 11A and 11B are simplified cross-sectional side views showing a method for generating a reference substrate in which a barrier layer is formed between particle-like surface features and the substrate surface.
Figure 11B:
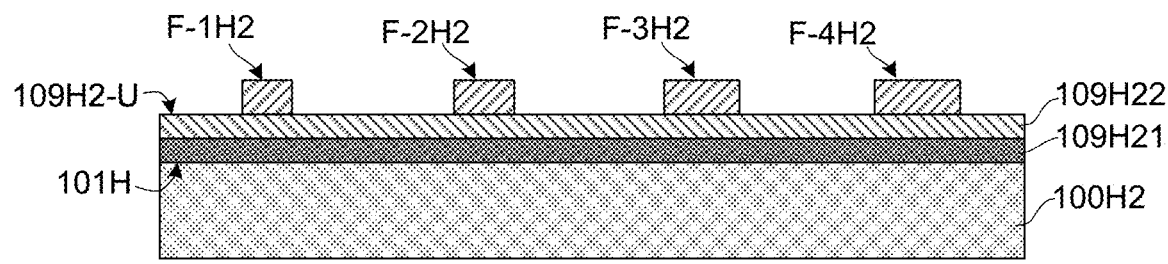
Figure 12A:
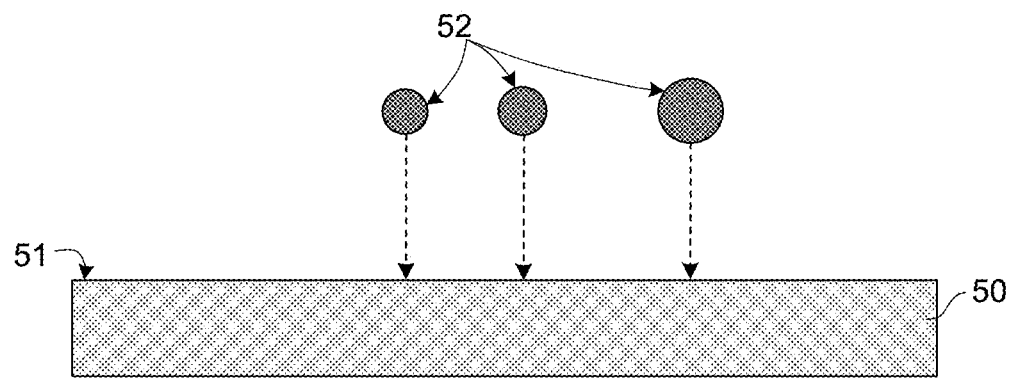
FIGS. 12A and 12B are simplified cross-sectional side views showing a conventional inspection system calibration method.
Figure 12B:
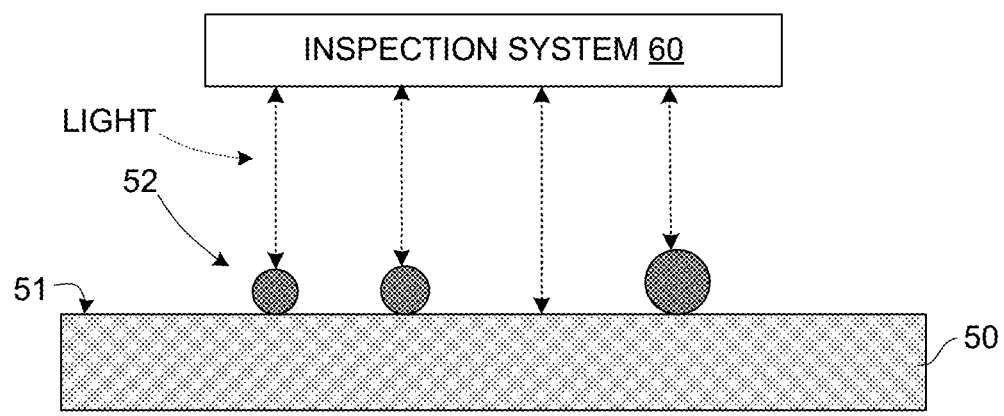

FIGS. 11A and 11B depict alternative exemplary embodiments in which particle-type environmentally inert surface features are formed on barrier films that serve to protect the underlying reference substrates (i.e., such that at least one barrier film layer is disposed between the environmentally inert surface features and the planar upper surface of the reference substrate. One of the issues with using the surface of a silicon wafer is that silicon is not stable in non-inert environments, and silicon will react with many particles that are otherwise well characterized and stable. FIG. 11A depicts a reference substrate 100H1 implementing a first approach that overcomes this problem by forming an environmentally inert barrier film layer 109H1 (e.g., silicon oxide or nitride) on planar surface 101H and then forming environmentally inert surface features F-1H1 to F-4H1 using an environmentally stable (second) material (e.g., platinum or gold) on an upper surface 109H1-U of barrier layer 109H1. Surface features F-1H1 to F-4H1 may be formed on barrier layer 109H1, for example, using processes similar to those described above with reference to FIGS. 5A-5C and 6A-6D. FIG. 11B depicts a reference substrate 100H2 implementing an alternative approach that includes forming an additional coating layer 109H22 (e.g., platinum) formed on a barrier layer 109H21 (e.g., silicon oxide or nitride) before forming environmentally inert surface features F-1H2 to F-4H2 on an upper surface 109H2-U of coating layer 109H2.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A reference substrate configured to provide a reference standard for calibrating an inspection system that is operably configured to detect at least one of a particle and a defect having a size dimension below 18 nm, wherein the reference substrate comprises a plurality of environmentally inert surface features that are respectively fixedly disposed on a planar surface of the reference substrate, wherein each of the environmentally inert surface features is configured to emulate said one of said particle and said defect having said size dimension below 18 nm.

2. The reference substrate of claim 1, wherein the reference substrate consists essentially of a first material, and said planar surface has a first surface roughness, and wherein each said environmentally inert surface feature comprises at least one of a second material and a second surface roughness.

3. The reference substrate of claim 1, wherein each said environmentally inert surface feature comprises a void region extending from the planar surface into the reference substrate.

4. The reference substrate of claim 3, further comprising a filler structure disposed in said each environmentally inert surface feature and having an upper surface that is coplanar with said planar surface of said reference substrate.

5. The reference substrate of claim 1, wherein each said environmentally inert surface feature comprises a particle-emulating structure disposed over the planar surface of said reference substrate.

6. The reference substrate of claim 5, further comprising at least one barrier film disposed between said each environmentally inert surface feature and the planar surface of said reference substrate.

7. A method for generating a reference substrate configured to provide a reference standard for calibrating an inspection system that is operably configured to detect defects having size dimensions below 18 nm, wherein the method comprises forming a plurality of environmentally inert surface features that are respectively fixedly disposed on a planar surface of the reference substrate, wherein each of the environmentally inert surface features is configured to emulate at least one of a particle and a defect having a size dimension below 18 nm.

8. The method of claim 7, wherein forming each said environmentally inert surface features comprises directing a focused ion beam onto a selected region of the planar surface such that the focused ion beam abrades a portion of the reference substrate, whereby said each environmentally inert surface feature is defined by a corresponding void region extending from the planar surface into the reference substrate.

9. The method of claim 7, wherein forming each said environmentally inert surface features comprises depositing a film layer on the planar surface and then lithographically patterning the film layer such that said each environmentally inert surface features comprises a residual portion of the film layer.

10. The method of claim 9, wherein patterning the film layer comprises forming a mask structure over an initial portion of the film layer, and then performing an over-etch process such that a size of the residual portion is smaller than a corresponding size of the mask structure.

11. The method of claim 7, wherein forming each said environmentally inert surface features comprises depositing a reactive material particle on the planar surface, then causing the reactive material particle to react with an underlying portion of reference substrate in a manner that forms a compound region in the reference substrate, and then selectively removing said compound region, whereby said each environmentally inert surface feature comprises a void region formed by the selective removal of said compound region.

12. The method of claim 7, wherein forming each said environmentally inert surface feature comprises depositing a pin-hole inducing particle over an associated surface location of the planar surface, then forming a protective film on the planar surface that surrounds the pin-hole inducing particle, and then utilizing one or more etchants to selectively remove the pin-hole inducing particle and a portion of the reference substrate located below the associated surface location, whereby said each environmentally inert surface feature comprises a void region extending from the associated surface location into the reference substrate.

13. The method of claim 12, wherein utilizing said one or more etchants comprises performing one of:
an anisotropic etch of said reference substrate such that said each environmentally inert surface feature comprises a substantially straight-sided void region in said reference substrate; and
an isotropic etch of said reference substrate such that said each environmentally inert surface feature comprises a pyramid-shaped void region in said reference substrate.

14. The method of claim 12, wherein forming each said environmentally inert surface feature further comprises:
forming a filler layer comprising a filler material on the planar surface such that a filler portion of the filler layer is disposed in said each environmentally inert surface feature and an upper portion of the filler layer is disposed over the planar surface; and
selectively removing the upper portion of the filler layer such that the planar surface is exposed and the filler portion of the filler layer is disposed in said each environmentally inert surface feature and has an upper surface that is coplanar with said planar surface.

15. The method of claim 7, wherein forming said plurality of environmentally inert surface features comprises depositing a barrier film layer on the planar surface and then forming the plurality of environmentally inert surface features using a second material disposed on an upper surface of the barrier film layer such that the barrier film layer is disposed between the planar surface and the plurality of environmentally inert surface features.

16. The method of claim 15, wherein said second material comprises one of platinum (Pt) and gold (Au).

17. The method of claim 16, wherein forming said plurality of environmentally inert surface features further comprises forming a platinum coating layer between the barrier film layer and the plurality of environmentally inert surface features such that the plurality of environmentally inert surface features are dispose on an upper surface of the platinum coating layer.

18. The method of claim 7, further comprising measuring an actual size value for each of said plurality of environmentally inert surface features and recording the measured size values for reference by said inspection system.

19. The method of claim 18, wherein measuring the actual size value for each of said plurality of environmentally inert surface features comprises utilizing a scanning electron microscope.

20. A method for operating an inspection system including an optical sub-system that is operably configured to detect at least one of a target particle and a target defect having a particle/defect size below 18 nm, the method comprising:
calibrating the inspection system using a reference substrate including a plurality of environmentally inert surface features that are respectively fixedly disposed on a planar surface of the reference substrate, wherein each of the environmentally inert surface features is configured to emulate at least one of said target particle and said target defect having said particle/defect size below 18 nm and includes associated recorded size data indicating a pre-measured actual size dimension of said each environmentally inert surface feature, and wherein said calibrating includes utilizing said optical sub-system to scan the planar surface and to generate first waveform data using light reflected/scattered from said each environmentally inert surface feature; and
utilizing said calibrated inspection system to determine a particle/defect size of said at least one of said target particle and said target defect having said particle/defect size below 18 nm by utilizing said optical sub-system to generate second waveform data for said each detected particle and defect, comparing said generated second waveform data with said waveform data of each of said plurality of environmentally inert surface features, and assigning said associated recorded size data of a corresponding said environmentally inert surface feature whose generated first waveform data matches said generated second waveform data.

* * * * *